US005617025A

United States Patent [19]
Taylor et al.

[11] Patent Number: 5,617,025
[45] Date of Patent: Apr. 1, 1997

[54] SIDE PART SENSOR FOR DETERMINING THE PRESENCE OR ABSENCE OF A NUT AND A HOLE DISPOSED ADJACENT THE NUT

[75] Inventors: John T. Taylor, Saline; Richard R. Johnson, Ann Arbor; William B. Ezell, Jackson, all of Mich.

[73] Assignee: Syron Engineering & Manufacturing Corporation, Saline, Mich.

[21] Appl. No.: 325,487

[22] Filed: Oct. 19, 1994

[51] Int. Cl.$^6$ .............................. G01N 27/72; G01B 7/06
[52] U.S. Cl. ............................................ 324/236; 324/230
[58] Field of Search .................................. 324/219, 228, 324/229, 234, 236, 225, 207.15, 207.16, 207.22, 207.26, 230, 237

[56] References Cited

U.S. PATENT DOCUMENTS

| | | | |
|---|---|---|---|
| 2,540,588 | 2/1951 | Long | 324/219 |
| 3,075,144 | 1/1963 | Cooper | 324/219 |
| 3,825,822 | 7/1974 | Forster | 324/219 |
| 4,526,177 | 7/1985 | Rudy et al. | 324/236 X |
| 4,629,984 | 12/1986 | Scalese | 324/219 |
| 4,906,926 | 3/1990 | Rogacki et al. | |
| 5,034,690 | 7/1991 | Taliaferro | 324/266 X |
| 5,079,502 | 1/1992 | Rogacki et al. | |
| 5,140,264 | 8/1992 | Metala et al. | 324/219 |
| 5,414,508 | 11/1983 | Davis et al. | 324/219 |

Primary Examiner—Sandra L. O'Shea
Assistant Examiner—Roger Phillips
Attorney, Agent, or Firm—Howard & Howard

[57] ABSTRACT

An improved sensor includes an inductor coil which is formed about a central axis. The inductor coil is configured to provide a magnetic field radially outwardly of the central axis. The monitor circuit monitors changes in the impedance of the coil, to in turn provide an indication of the amount of metal mass radially outwardly of the sensor. The monitor circuit is set to be triggered at a particular amount of metal mass, which would in turn be tailored to the particular application. In one desired application, the sensor is utilized to detect the presence of a nut in a metal plate. Metal plates as are typically utilized with vehicles will often include a number of holes which are to receive nuts. If the nuts are not received in the holes, then that particular metal plate should not be further assembled into the product. One widespread use of such a technique is with the assembly of vehicle bodies. The side sensor will detect the presence of a nut in the hole when positioned within the bore of the nut. The use of the radially outwardly directed magnetic field provides a much more accurate indication of the presence of the nut than prior art "forward looking" sensors.

27 Claims, 4 Drawing Sheets

SIDE PART SENSOR FOR DETERMINING THE PRESENCE OR ABSENCE OF A NUT AND A HOLE DISPOSED ADJACENT THE NUT

BACKGROUND OF THE INVENTION

This invention relates to proximity sensors and related circuits for detecting the presence of metal mass radially surrounding the sensor.

Proximity sensors are used in manufacturing and material handling applications for detecting the presence or placement of metal workpieces. Generally proximity sensors generate a magnetic field from an inductor coil. When a metal workpiece is brought into the magnetic field emitted from the sensor, eddy current losses in the metal workpiece cause the impedance of the inductor coil to decrease. This decrease in impedance of the inductor coil is detected in monitor circuitry which signals the presence of a metal workpiece in the magnetic field.

One current use of such sensors is to determine whether weld nuts or pierce nuts have been properly affixed to holes formed in a vehicle body panel. Many nuts are inserted into body panels, such as vehicle body panels. Occasionally, one of the nuts may be missing or could be broken during installation. Missing nuts in body panels are sometimes not detected until after the defective metal plate or body panel has been assembled with several other components or incorporated into a vehicle, at which time remedial steps are costly and time consuming.

Current sensors are forward-looking; i.e., they only detect whether a metal workpiece is present in front of the sensor. Forward-looking proximity sensors are not ideally suited for some applications. As an example, these sensors do not always properly detect the presence of a nut fastened to a body panel as described above. The eddy current losses in the body panel itself decrease the impedance of the inductor coil, thus making the detection somewhat complex for forward looking sensors.

SUMMARY OF THE INVENTION

The present invention provides a sensor that "looks" radially outwardly, and is thus capable of accurately detecting the presence or absence of a part, such as a nut in a body panel. While the specific invention is described as a nut sensor, it should be understood that other parts may be sensed with this invention. The inventive side sensor thus allows an industrial controller to interrupt the manufacturing or assembly operation to remove or repair the defective plate or body panel before it is assembled or is incorporated into a product. Detection by the side sensor of the missing nut at this early stage reduces the cost of remedial measures and increases the quality of the finished product.

In a sense, the sensor circuitry is pre-set such to a particular expected mass radially outwardly of the sensor. The value can be adjusted to tailor the sensor's movement between present and not present conditions based upon the particular variables encountered in the particular application, such as a nut present and a nut not present signal.

The side sensor preferably includes a tubular probe containing an inductor coil wrapped around a magnetic core. Preferably, the core is ferrite. The sensor is also housed in a non-magnetic stainless steel housing. The inductor coil is oriented coaxially with the probe to cause a magnetic field to be generated radially outwardly from the side sensor.

Eddy current losses in the magnetic field cause the impedance of the inductor coil to decrease. Eddy current losses are a function of metal mass within the magnetic field, and the proximity of the metal mass in the magnetic field. The inventive side sensor can thus determine the presence of a part, such as a nut by sensing the metal mass radially surrounding the side sensor. The radially outwardly looking sensor and method of the present invention recognize the difference in mass of metal present in the magnetic field between a nut in a metal plate and a metal plane alone. Eddy current losses in the nut and plate exceed eddy current losses in the metal plate alone; consequently, the decrease in the impedance of the inductor coil caused by a nut and the plate exceeds the decrease in impedance of the inductor coil caused by the plate alone.

In accordance with one embodiment of this invention, a monitor circuit is provided for measuring the impedance of the inductor coil and generating a signal to indicate the presence or absence of a nut in the metal plate. The side sensor monitor circuit is adjustable so that changes in the impedance in the inductor coil due to eddy current losses in the nut and plate are properly distinguished from those caused by eddy current losses in the plate alone. Further, the monitor circuit is adjusted so that the mass of the nut must surround the sensor completely, or the sensor will indicate the lack of a nut. This will identify broken nuts, etc.

These and other advantages of the present invention, will become readily apparent to those skilled in the art from the following detailed description of a preferred embodiment when considered in the light of the accompanying drawings, of which the following is a brief description.

DESCRIPTION OF THE PREFERRED EMBODIMENT

Figure 1:
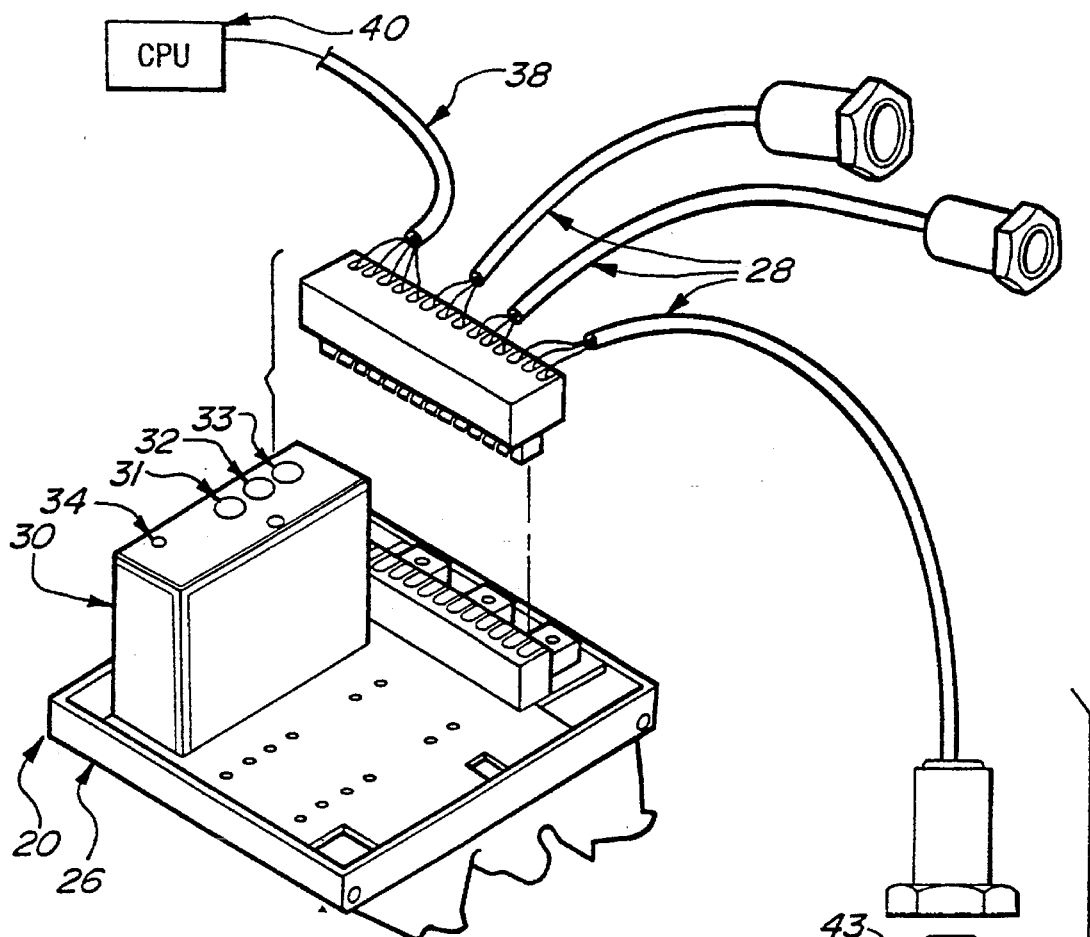
FIG. 1 is a perspective view of one embodiment of the side sensor and monitor utilized to detect the presence of a nut in a metal plate.

FIG. 1 illustrates a side sensor system 20 in accordance with one embodiment of the present invention adapted to detect the presence of a nut 22 in a metal plate 24. A motherboard 26 connects a plurality of sensor connector cables 28 to an equal number of corresponding monitors 30 (only one shown). The monitor 30 has three LED indicators for signalling "power on" 31, "nut present" 32, and "coil broken/sensor not connected" 33. The LED 32 is lighted to indicate the presence of a nut 22 and is dark when the nut 22 is absent. A monitor adjustment potentiometer 34 having an adjustment screw (not shown) is mounted on the top of each monitor 30. A plurality of output wires 38 from the motherboard 26 can be sent to a CPU or industrial controller 40 to indicate the presence or absence of the nut 22 in the plate 24 and other operating information. Each of the sensor connector cables 28 is connected to a side sensor 42 (only one shown) using jam nuts 43. Each side sensor 42 may be mounted on a bracket 44.

Figure 2:
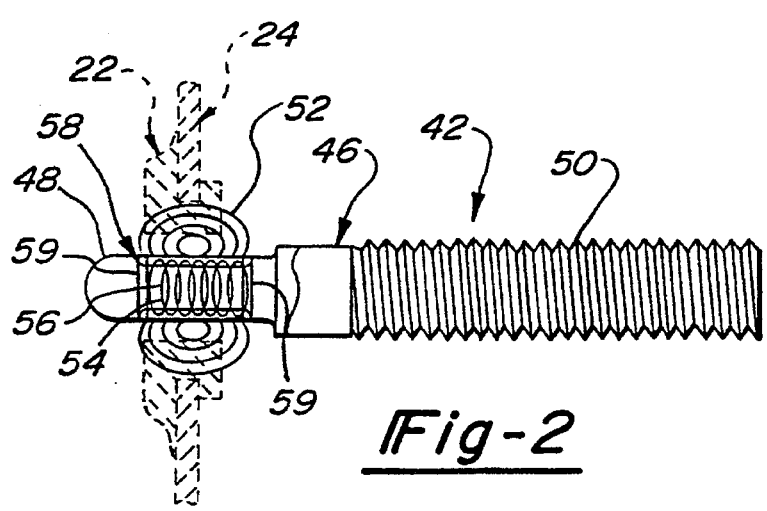
FIG. 2 is a cross-section view of the side sensor probe of FIG. 1, partially broken away.

As shown in FIG. 2, the side sensor 42 includes a probe 46 which is preferably a thin-wall non-magnetic stainless steel tube having a closed end 48 and an opposite end 50 which is externally threaded. A magnetic field 52 is generated by an inductor coil 54, comprising a length of wire 56, coiled around a ferrite core 58.

The magnetic core 58 is generally cylindrical and preferably has a flange 59 on each axial end. Many types of cores and coils may be used. As one example, a ferrite Bobbin core 58 such as Fair-Rite Products Corp. part number 9677001165, approximately 0.5" in length and having approximately a 0.2" O.D., may be used to construct the side sensor 42. The inductor coil 54 may be formed by making 800 turns around the ferrite core 58 of 38 AWG heat strippable magnet wire 56, making approximately 10 layers at 80 turns per layer. Both ends of the wire 56 are brought to one flanged end 59 of the ferrite core, where they pass through a notch (not shown) in the flange 59. Adhesive preferably secures the ends of the wire 56 at the notch. The wound core 54, 58 is preferably lightly coated with a clear spray paint or dipped in coil dope or other suitable sealant.

The inductor coil 54 and ferrite core 58 are disposed within the closed end 48 of the probe 46 and are oriented coaxially with the probe 46 thereby causing the magnetic field 52 to radiate radially outwardly from the probe 46. It is preferred that the magnetic field 52 radiate from a portion of the probe 46 generally equal in length to the thickness of the metal workpiece to be detected. For example, if the side sensor 42 were used to detect the presence of the pierce nut 22 in the metal plate 24 as shown in FIG. 1, the side sensor 42 would preferably generate magnetic field 52 along a length of probe 46 which is larger than the thickness of the plate 24 and generally the same as the thickness of nut 22.

Figure 3:
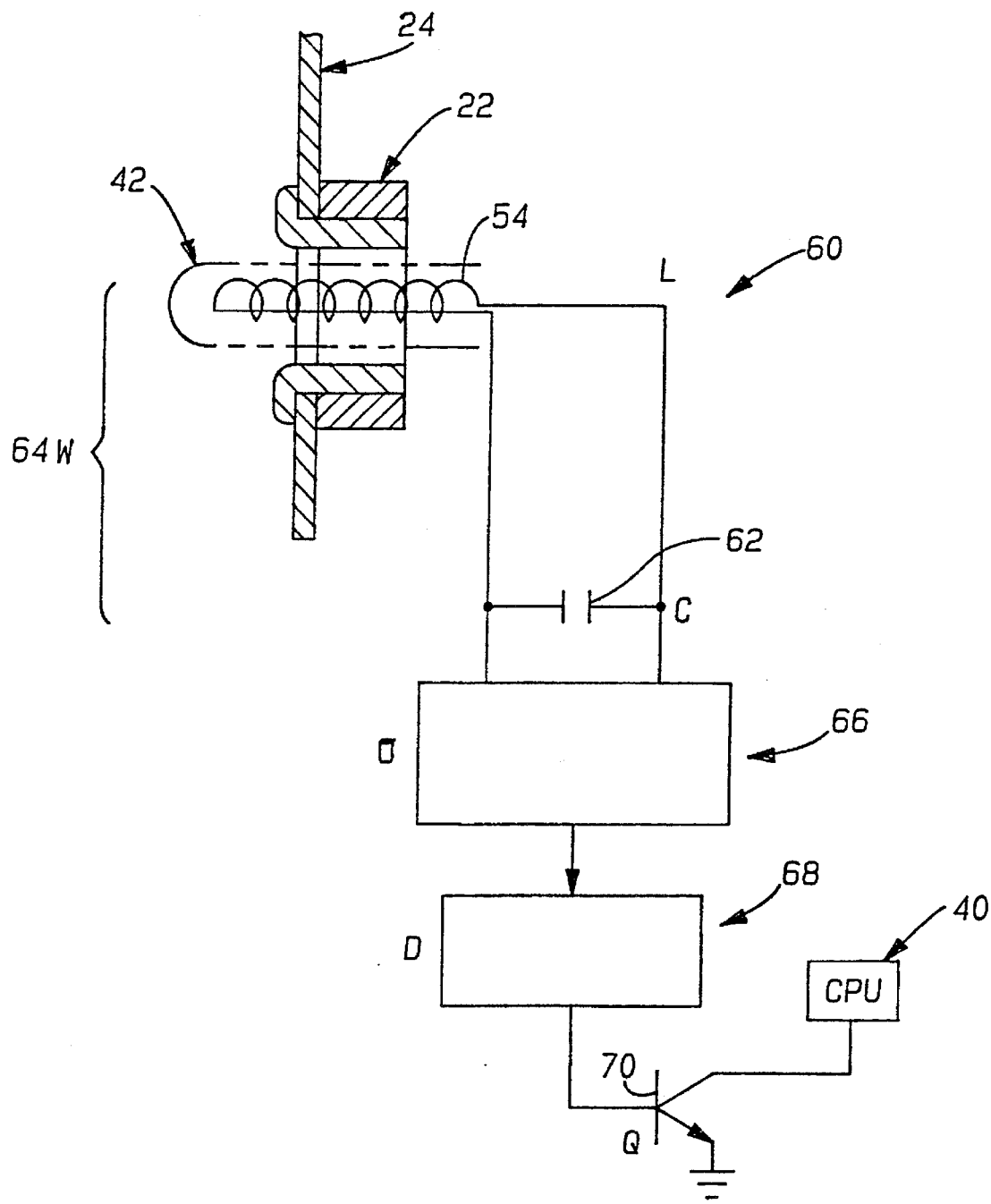
FIG. 3 is a block diagram of the monitor circuit and side sensor of FIG. 1.

FIG. 3 shows a block diagram of one example of circuitry 60 for the monitor 30 which enables the side sensor 42 to detect a nut 22 radially surrounding the side sensor 42. The inductor coil 54 and a capacitor 62 form a resonant circuit 64 which forms one leg of a bridge in an oscillator circuit 66. The oscillator output is monitored by detector circuitry 68 which in turn drives a transistor switch 70. The transistor switch 70 provides a signal to the CPU 40 to signal the presence or absence of the nut 22 in the metal plate 24.

Figure 4:
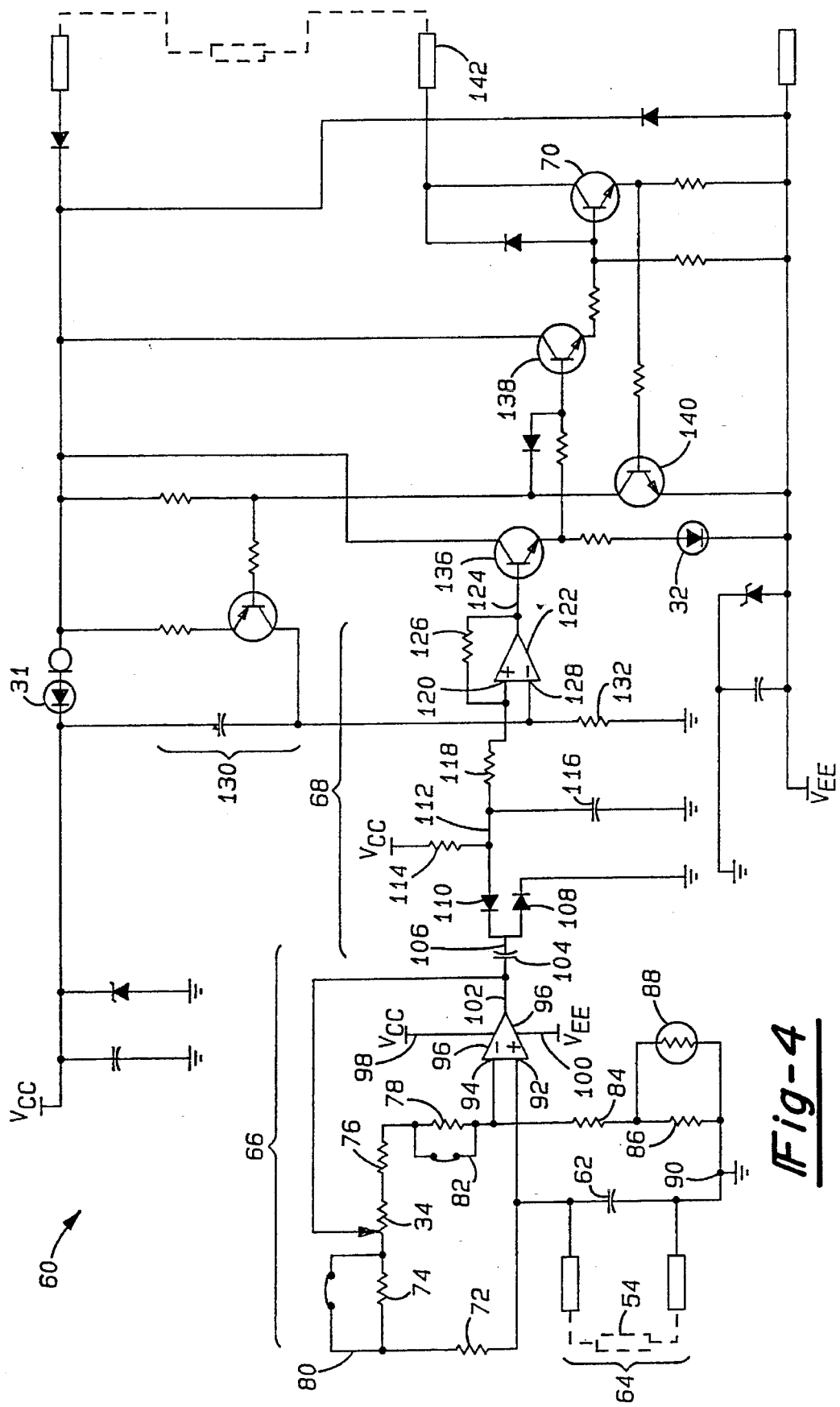
FIG. 4 is a schematic diagram of an electrical circuit embodiment according to the present invention.

A preferred monitor circuit 60 is shown in FIG. 4, which is a schematic for an oscillator circuit, generally 66, detector circuit, generally 68, and switch, generally 70. The oscillator circuit 66 includes a bridge circuit having first and second arms each formed by two resistors 72, 74, 76, and 78. A solder trace 80, 82 on each arm normally short-circuits one resistor 74, 78 on each arm. The solder traces 80, 82 can be cut for rough adjustment of the monitor circuit 60. The two arms are connected by the monitor adjustment potentiometer 34. A first leg of the bridge is formed by two resistors 84, 86, one of which is connected in parallel with a temperature compensating thermistor 88. The remaining leg of the bridge is formed by the parallel resonant circuit 64 which includes the inductor coil 54 and the capacitor 62. A bridge node 90 and the potentiometer 34 are power inputs to the bridge circuit and two bridge nodes 92, 94 are outputs of the bridge circuit. The outputs bridge nodes 92, 94 are fed into an OP/AMP 96 which amplifies their difference and receives a power supply voltage at two inputs 98, 100. The bridge output node 92 is the non-inverting input node 92 of the OP/AMP 96 and is connected to the resonant circuit 64. The output 102 of the OP/AMP 96 is fed back to the potentiometer 34 and provides an output signal to the detector circuit 68 by means of a capacitor 104.

The detector circuit 68 generally comprises a rectifier and a comparator. The detector 68 receives the output signal from the oscillator circuit 66 at an input node 106 connected to a first diode 108 having a cathode leading to ground, and a second diode 110 having an anode connected to a second node 112. A resistor 114 and a capacitor 116 connect power supply and ground to the second node 112. A second resistor 118 connects the second node 112 to the non-inverting input 120 of an OP/AMP 122 having an output 124 fed back by a resistor 126 to the non-inverting input 120. A reference voltage is realized at the inverting input 128 of the OP/AMP 122 by means of a simple, normally off PNP transistor circuit 130 and a resistor 132.

In operation, the circuit of FIGS. 3 and 4 can be used with a side sensor 42 to determine the presence of nut 22 in a metal plate 24 as shown in FIGS. 1 and 2. The size of the inductor coil 54 is preferably chosen to generate a magnetic field 52 which is generally the same length as the thickness of the nut 22 in place. When a sufficient metal mass is present in the magnetic field 52 radially surrounding the probe 46, the impedance of the inductor coil 54 is decreased sufficiently to bring the oscillator circuit 66 into balance and the oscillator circuit 66 will cease to oscillate. The potentiometer 34 is adjusted so that the nut 22 in the metal plate 24 provide sufficient metal mass in the magnetic field 52 radially surrounding the probe 46 to bring the oscillator circuit 66 into balance. If the nut does not surround the sensor, or if there is no nut, but the plate 24 alone, there is not sufficient metal mass to indicate a nut. The oscillator circuit 66 will continue to oscillate if the nut 22 is not present.

When there is no metal present in the magnetic field 52, the resonant circuit 64 operates at a resonance and has a constant impedance. When the inductor coil 54 in the probe 46 is inserted into the nut 22 in the metal plate 24, the impedance of inductor coil 54 decreases as a function of the surrounding metal mass. A reduction in the impedance of the resonant circuit 64 will decrease the feedback to the OP/AMP non-inverting input 94. If the impedance of the resonant circuit 64 and consequently the feedback to the non-inverting input 94 are decreased sufficiently, the oscillator circuit 66 will be brought into balance. The cessation of oscillation indicates that there is sufficient metal mass present in the magnetic field 52 radially outward of the side part sensor; i.e., there is a nut 22 in the metal plate 24.

The output from the oscillator 66 is rectified and level shifted at the second 112 node of the detector circuit 68. When the input to the detector 68 ceases oscillation, the OP/AMP 122 is switched on by the increase in voltage at the non-inverting input 120. The OP/AMP 122 amplifies the difference between its inputs 120, 128 and drives a series of coupled transistors 136, 138, 70. The transistor 136 turns on the LED 32 and transistor 138. Transistor 138 drives transistor 70, and transistor switch 70 drives a CPU or industrial controller 40 to signal that the nut 22 is present and surrounding the side sensor 42. In the absence of such a signal, the LED 32 remains unlit and a no-nut signal is sent to the CPU 40. If the current through transistor 70 is excessive or the load at 142 is shorted, transistor 140 turns on, which, in turn, pulls reference circuit 130 to a higher voltage, and 122 turns off. Hysteresis through 126 cycles the overload protection on and off.

In other features of this invention, sensor protector equipment may be incorporated into the axial end 48 of sensor 42.

Figure 5:
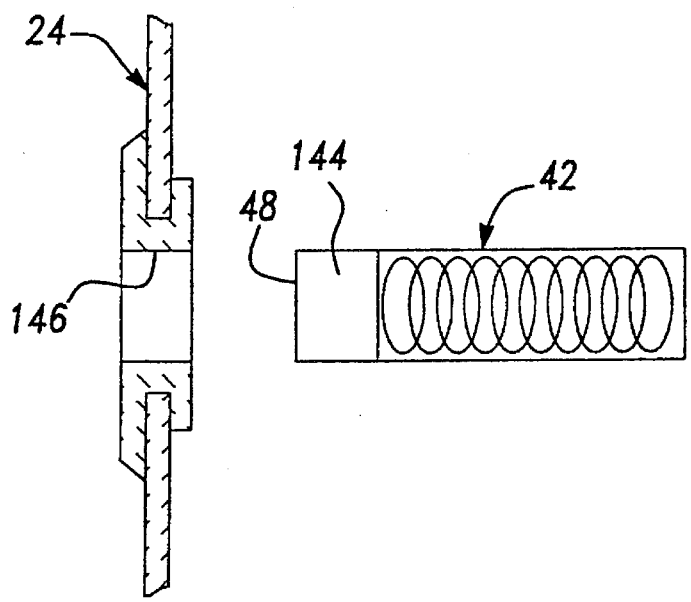
FIG. 5 is a schematic diagram of a probe having a forward facing sensor.
Figure 6:
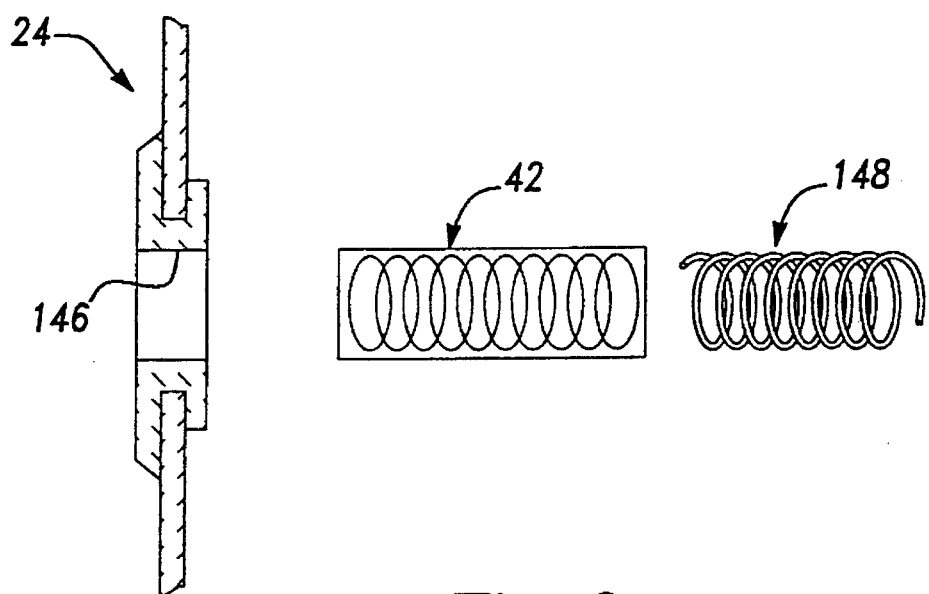
FIG. 6 is a schematic diagram of a spring biased probe.

In one example, shown in FIG. 5, a forward facing sensor 144 could be incorporated into the end 48 to detect whether a hole 146 is even present in the workpiece 24. Thus, should the sensor 42 not be aligned with a hole, but rather be mispositioned, the metal plate 24 will not be brought into contact with sensor 42, potentially damaging the sensor 42. As an alternative to such an arrangement, the sensor 42 may be spring 148 biased to its operative position as shown in FIG. 6. In that instance, should a metal plate 24 that lacks a hole 146 be brought into contact with sensor 42, sensor 42 would then be biased away from plate 24.

The determination of the particular frequencies and values associated with the circuitry and its operation would be well within the skill of a worker in this art. This invention is directed more to the arrangement of the sensor coil, and its operation to sense mass radially outwardly of the sensor.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. A method for determining the presence or absence of a nut at a hole in a metal plate comprising the steps of:
    a) providing a probe which generates a radially outwardly directed magnetic field, said probe having an associated impedance, and providing means to prevent said probe from being forced against a metal plate, if said probe is not aligned with a hole in the metal plate;
    b) moving said probe toward a metal plate, said means to prevent further movement preventing said probe from being crushed against said metal plate if said probe is not aligned with a hole in said metal plate;
    c) inserting said probe into a hole in a metal plate;
    d) generating said magnetic field, and sensing the mass radially outwardly of said probe;
    e) measuring changes in the impedance of said probe;
    f) comparing the impedance of said probe to a predetermined impedance value; and
    g) generating a signal indicative of the presence or absence of said nut at the hole in the metal plate, by monitoring the mass based upon said comparison of said impedance of said probe.

2. The method according to claim 1 wherein said probe has an associated impedance value, said method further comprising the step of measuring changes in the impedance value of said probe.

3. The method according to claim 1 wherein said probe is tubular and includes an inductor coil oriented coaxially within said probe.

4. A method for sensing mass in a selected plane radially surrounding a selected point on said plane, said method comprising the steps of:
    a) providing a probe which generates a radially outwardly directed magnetic field, relative to an axis;
    b) placing said probe generally at said selected point, orienting said axis of said probe generally perpendicular to said plane;
    c) generating said magnetic field, said magnetic field sensing mass radially outwardly of said axis of said probe;
    d) ceasing the generation of said magnetic field upon sensing sufficient mass radially surrounding said probe; and,
    e) generating a signal in response to said mass in said selected plane radially surrounding said selected point on said plane upon said magnetic field sensing sufficient mass radially surrounding said probe.

5. The method according to claim 4 wherein said probe has an associated impedance value, said method further including the steps of:
    e) measuring changes in the impedance value of said probe;
    f) comparing said impedance to a predetermined impedance value; and,
    g) indicating the presence or absence of a nut based upon said comparison.

6. The method according to claim 4 wherein said probe comprises an inductor coil having a length of wire coiled about the axis of said probe.

7. The method according to claim 6 wherein said inductor coil is coiled about a generally cylindrical magnetic core.

8. The method according to claim 7 wherein said generally cylindrical magnetic core includes a flange on each axial end.

9. A side sensor for sensing radially surrounding metal mass comprising:
    a probe having an axis;
    a coil including a length of wire coiled around said axis and having an impedance value, said coil disposed within said probe, and oriented coaxially with said probe to generate a radially outwardly directed magnetic field;
    a monitor circuit for measuring changes in the impedance of said coil, said monitor circuit including an oscillating circuit, said oscillating circuit including said coil, said coil having an impedance such that said oscillating circuit generates an oscillating signal when insufficient metal mass surrounds said coil and such that said oscillating circuit ceases generating an oscillating signal when a sufficient predetermined metal mass surrounds said coil; and
    means to prevent said probe from being forced against a metal panel, if there is no hole in the metal panel to receive said probe.

10. The side sensor according to claim 9 wherein said side sensor further comprises a generally cylindrical ferrite core disposed within said coil.

11. The side sensor according to claim 10 wherein said generally cylindrical ferrite core includes a flange on each axial end.

12. The side sensor according to claim 9 wherein said probe is housed in a stainless steel.

13. The side sensor according to claim 9 wherein said monitor circuit further includes detector means, coupled to said signal from said oscillator means, for defining a reference value and for comparing said amplitude of said signal with said reference value and for generating a second signal therefrom in response to said comparison.

14. The side sensor according to claim 13 wherein said oscillator means comprises a resistance bridge having a plurality of legs in which said coil comprises one of said legs and two nodes of said bridge form inputs to an amplifier and the amplifier output is connected to another node of said bridge.

15. The method according to claim 4 wherein said step d includes the steps of:
    e) comparing said mass to a predetermined value;
    f) indicating the presence or absence of said nut based upon said comparison.

16. The method according to claim 4 wherein said coil is part of an oscillating circuit, said step d including the steps of:

generating an oscillating signal;

ceasing oscillation to indicate the presence of a predetermined mass radially surrounding said probe.

17. The method according to claim 1 further including the step of determining the presence or absence of said hole in said metal plate.

18. The side sensor according to claim 9 wherein said monitor circuit further includes detector means, coupled to said oscillating circuit, for defining a reference value and for comparing said amplitude of said signal with said reference value and for generating a second signal therefrom in response to said comparison.

19. A method for detecting the presence of a nut at a hole in a plate comprising the steps of:

a) securing a nut to a hole in a plate;

b) providing a probe having an impedance, and providing means to prevent said probe from being forced against a plate, if said probe is not aligned with a hole in the plate;

c) moving said probe towards a plate, said means to prevent further movement preventing said probe from being crushed against said plate if said probe is not aligned with a hole in said plate;

d) inserting said probe into said nut and said hole in said plate;

e) generating a magnetic field radially outwardly from said probe, said magnetic field sensing the mass radially outwardly of said probe, said mass radially surrounding said probe within said magnetic field changing said impedance of said probe;

f) measuring changes in the impedance of said probe;

g) comparing the impedance of said probe to a predetermined impedance value; and h) generating a signal indicative of the presence of said nut at the hole in said plate based upon said comparison of said impedance of said probe.

20. The method according to claim 19 wherein said magnetic field is oscillating at a predetermined frequency, said method further including the step of detecting when said magnetic field is not oscillating at said predetermined frequency to indicate the presense of sufficient mass radially surrounding said probe.

21. The method according to claim 20 wherein said coil is part of an oscillating circuit, further including the steps of:

generating an oscillating signal;

ceasing oscillation to indicate the presence of a nut on the plate.

22. A method as recited in claim 1, wherein said means to prevent includes mounting said probe on a spring such that said probe can overcome a bias force from said spring if said probe is brought into contact with said plate.

23. A method as recited in claim 1, wherein said means to prevent movement includes a sensor sensing forwardly of said probe and stopping movement of said probe if said axial sensor senses there is no hole forwardly of said probe.

24. A side sensor as recited in claim 9, wherein said means to prevent movement includes a spring mounting said probe, said probe being operable to overcome a spring force from said spring if said probe is moved into contact with a metal panel preventing said probe from being crushed against said metal panel.

25. A side sensor as recited in claim 9, wherein said means to prevent movement includes an axial sensor positioned forwardly of said coil in said probe, said axial sensor being operable to sense the presence of a hole forwardly of said probe, and stop movement of said probe if said axial sensor determines there is no hole forwardly of said probe.

26. A method as recited in claim 19, wherein said means to prevent includes mounting said probe on a spring such that said probe can overcome a bias force from said spring if said probe is brought into contact with said plate.

27. A method as recited in claim 19, wherein said means to prevent movement includes a sensor sensing forwardly of said probe and stopping movement of said probe if said axial sensor senses there is no hole forwardly of said probe.

* * * * *